(12) United States Patent
Huang et al.

(10) Patent No.: US 6,218,239 B1
(45) Date of Patent: Apr. 17, 2001

(54) MANUFACTURING METHOD OF A BOTTOM PLATE

(75) Inventors: Keh-Ching Huang, Hsinchu; Wen-Jeng Lin, Pan-Chiao; Tz-Guei Jung; Jacob Chen, both of Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/195,168

(22) Filed: Nov. 17, 1998

(51) Int. Cl.[7] .................................................. H01L 21/8242
(52) U.S. Cl. ............................................ 438/253; 438/396
(58) Field of Search ..................................... 438/253, 255, 438/396, 397, 645, 655, 682, FOR 212, FOR 220

(56) References Cited

U.S. PATENT DOCUMENTS 5,843,818 * 12/1998 Joo et al. .
5,929,473 * 7/1999 Nishihori et al. .
5,943,582 * 8/1999 Huang et al. .
6,004,857 * 12/1999 Hsiao et al. .
6,010,931 * 1/2000 Sun et al. .

* cited by examiner

Primary Examiner—George Fourson
Assistant Examiner—Barbara E. Abbott
(74) Attorney, Agent, or Firm—Thomas, Kayden, Horstemeyer & Risley

(57) ABSTRACT

The invention provides a manufacturing method of forming a bottom plate for a capacitor on a substrate, wherein the substrate comprises a MOS transistor having a gate and a pair of source/drain regions. A crown-liked conductive plate is formed over an insulation oxide layer and a contact plug. The crown-liked conductive plate penetrates the insulation layer and the stop layer, wherein the bottom of the crown-like conductive plate is electrically connected to the contact plug. The crown-like conductive plate, served as the bottom plate for a DRAM capacitor, is composed of tungsten silicide or a combination of a tungsten nitride layer and a tungsten layer.

10 Claims, 7 Drawing Sheets

MANUFACTURING METHOD OF A BOTTOM PLATE

BACKGROUND OF THE INVENTION

1. Field of the Invention

The present invention relates to a manufacturing method of a bottom plate of a capacitor. More particularly, the present invention relates to a manufacturing method of a crown structure of a capacitor in dynamic random access memory (DRAM).

2. Description of Related Art

With the steady improvement in integrated circuit (IC) fabrication, the dimensions of IC devices are greatly reduced. With a higher packing density, data transfer rate of IC products is higher while its functions and scope of applications continues to expand. In order to sustain the necessary growth, miniaturization of device dimensions in an IC chip has always been one major target in the semiconductor industry. This can be seen in the recent transition of manufacturing technologies from the VLSI to ULSI regime.

At present, one of the major products of integrated circuits in dynamic random access memory (DRAM). With the demand for packing more devices into a given wafer chip, available surface area of a capacitor for forming each memory cell is correspondingly reduced. The reducing of the available surface area causes electric charges stored in the capacitor insufficient and also causes data accessing difficult. That is, the data stored in the capacitor is easily lost and affected by other external factors. The repeating data refreshing operations are necessary for data safe storage, which increases the cost of operating the devices. Therefore, a demand for higher capacitance in a limited area of the device is continuously developed for storing more data. A method for higher capacitance of a capacitor is using a stacked structure or a crown structure of the capacitor for more surface area.

FIGS. 1A–1G shows cross-sectional views of a conventional manufacturing method of a bottom plate of a capacitor in the DRAM. Referring to FIG. 1A, a metal oxide semiconductor (MOS) transistor 102 is formed in a substrate 100. The MOS transistor 102 comprises a gate 102a, a pair of source/drain regions 102b and a spacer 102c. Next, an insulation oxide layer 104 is deposited over the substrate 100, and then a photo resist layer 106 is formed over the insulation oxide layer 104, in which a portion of the insulation oxide layer 104 is covered by the photo resist layer 106.

Referring to FIG. 1B, the exposed portion of the insulation oxide layer 104 is then etched to form a capacitor node contact opening 108 therein. One of the source/drain regions 102b is then exposed, as shown in FIG. 1B. Next, the photo resist layer 106 is removed.

Referring to FIG. 1C, a first polysilicon layer (not shown) is deposited over the insulation oxide layer 104 by, for example, a method of low-pressure chemical vapor deposition. The contact opening 108 is then filled with the polysilicon. The resistance of the first polysilicon layer is changed to about 500 $\mu\Omega$~1200 $\mu\Omega$ by heavily doping with ions. Therefore, the first polysilicon layer can be conductive material for the capacitor. The first polysilicon layer above the insulation oxide layer 104 is eliminated by, for example, a method of chemical mechanical polishing or etching back and then a portion of the first polysilicon layer in the contact opening 108 is changed into a contact plug 108a.

Next, referring to FIG. 1D, a second polysilicon layer 110 is formed over the insulation oxide layer 104 by, for example, a method of low-pressure chemical vapor deposition. The second polysilicon layer 110 is then heavily doped with ions. A photo resist layer 112 with a predetermined pattern is formed over the second polysilicon layer 110, for example, the photo resist layer 112 has an opening 112a above the position of the plug 108a. The exposed portions of the second polysilicon layer 110 are etched to form some grooves therein, for example, a groove 114 above the contact plug 108a as shown in FIG. 1E. After that, referring to FIG. 1F, the second polysilicon layer 110 is etched and changed to a crown-like bottom plate 110b by a photolithography precess. The crown-like bottom plate 110b is connected to the contact plug 108.

The conventional manufacturing method of a polysilicon bottom plate is described above. After the formation of the bottom plate, material with a high dielectric constant such as tantalum pentoxide is then deposited over the formed structure, for forming the capacitor. However, the crown-like structure of the bottom plate easily results in the leakage phenomenon, which bring the bottom plate not effectively storing the charges, that is, the bottom can not work well to be a function of capacitance.

In light of the foregoing, there is a need to provide a bottom plate, which reduces the leakage phenomenon and possesses a reliable function of capacitance.

SUMMARY OF THE INVENTION

Accordingly, the present invention is to provide a manufacturing method of forming a bottom plate for a DRAM capacitor capable of high-density packing and having large charge storage capacity. Furthermore, the method is compatible with current IC fabrication techniques.

To achieve these and other advantages and in accordance with the purpose of the invention, as embodied and broadly described herein, the invention provides a manufacturing method of forming a bottom plate for a capacitor on a substrate, wherein the substrate comprises a MOS transistor having a gate and a pair of source/drain regions, wherein the method comprises, at first, forming an insulation oxide layer on the substrate and the gate. Next, forming a contact opening in the insulation oxide layer, wherein one of the source/drain regions is exposed through the contact opening. Next, forming a contact plug in the contact opening. Next, forming a stop layer over the insulation oxide layer and the contact plug. Next, forming a first dielectric layer over the stop layer. Then, forming an opening which penetrates the first dielectric layer, the stop layer and the insulation oxide layer, wherein the bottom of the opening exposes a portion of the insulation oxide layer and the top portion of the contact plug. Finally, forming a crown-liked conductive plate over the insulation oxide layer and the contact plug, wherein the crown-liked conductive plate penetrates the insulation layer and the stop layer, wherein the bottom of the crown-like conductive plate is electrically connected to the contact plug, wherein the crown-like conductive plate is composed of tungsten silicide.

To achieve these and other advantages and in accordance with the purpose of the invention, as embodied and broadly described herein, the invention provides a manufacturing method of forming a bottom plate for a capacitor on a substrate, wherein the substrate comprises a MOS transistor having a gate and a pair of source/drain regions, wherein the method comprises: forming an insulation oxide layer on the substrate and the gate; forming a contact opening in the insulation oxide layer, wherein one of the source/drain regions is exposed through the contact opening; forming a contact plug in the contact opening; forming a stop layer over the insulation oxide layer and the contact plug; forming a first dielectric layer over the stop layer; forming an opening which penetrates the first dielectric layer, the stop layer and the insulation oxide layer, wherein the bottom of the opening exposes a portion of the insulation oxide layer and the top portion of the contact plug; and forming a crown-liked conductive plate over the insulation oxide layer and the contact plug, wherein the crown-liked conductive plate penetrates the insulation layer and the stop layer, wherein the bottom of the crown-like conductive plate is electrically connected to the contact plug, wherein the crown-like conductive plate is composed of a tungsten nitride layer and a tungsten layer on the tungsten nitride layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
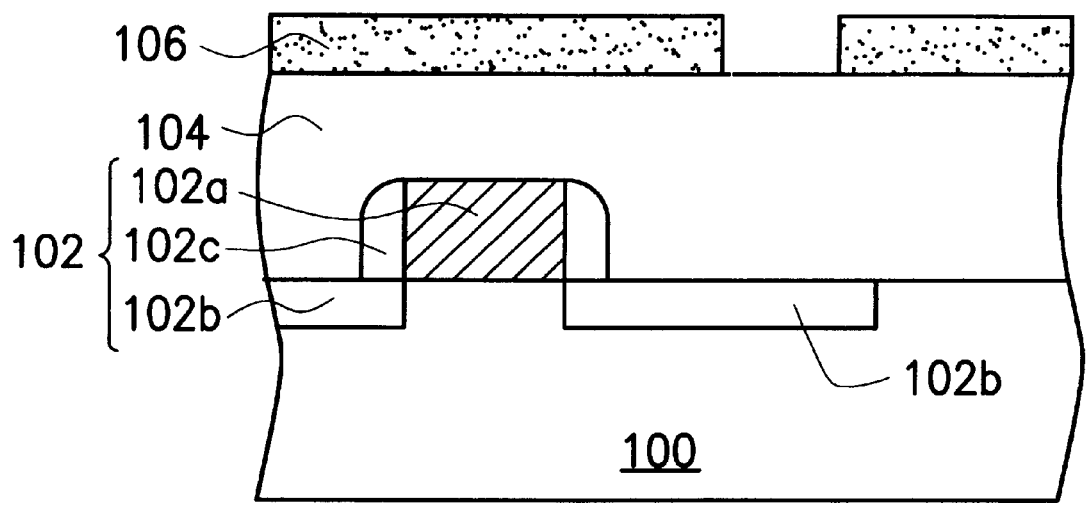
FIGS. 1A–1F show cross-sectional views of a conventional manufacturing method of a crown-like bottom plate of a capacitor.
Figure 1B:
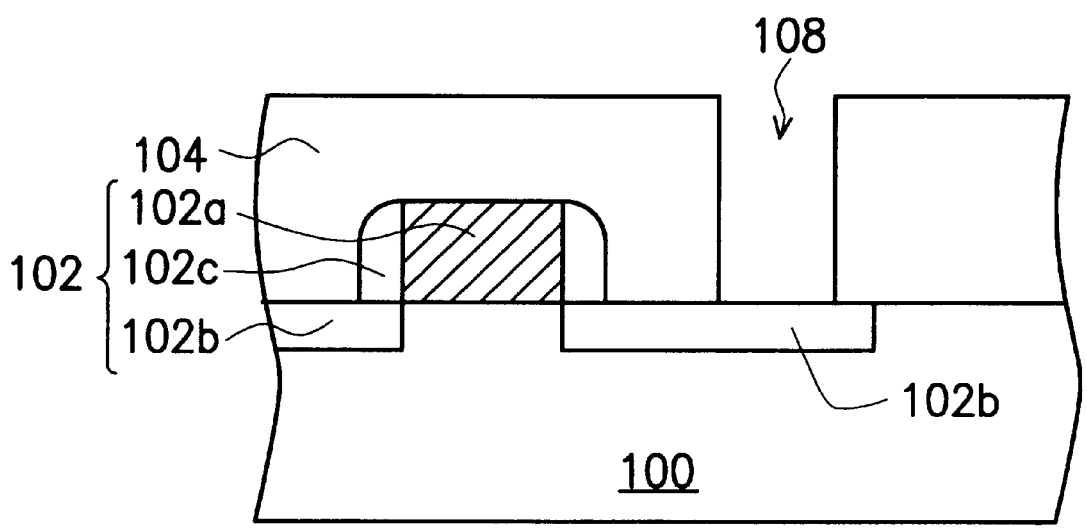
Figure 1C:
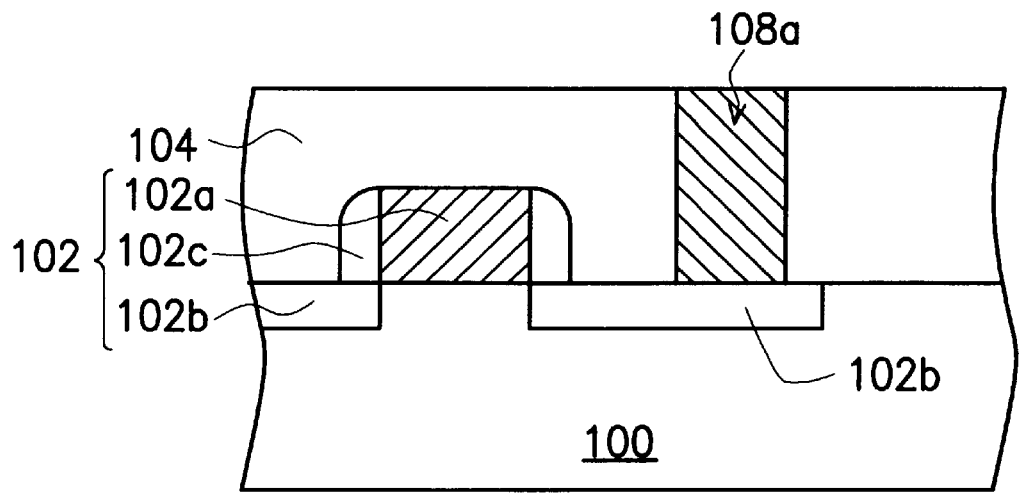
Figure 1D:
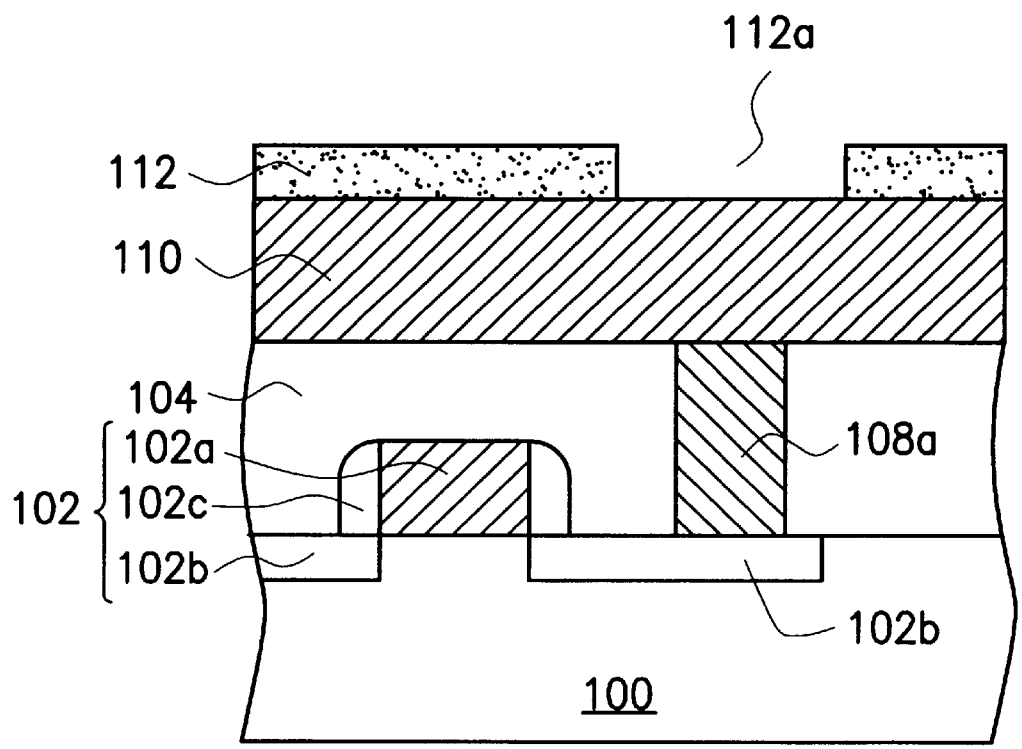
Figure 1E:
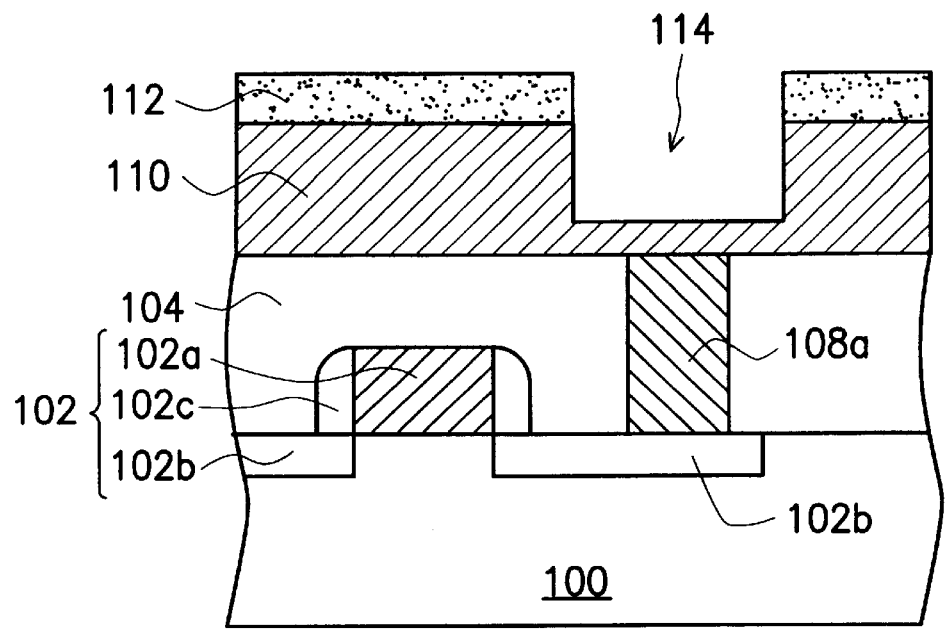
Figure 1F:
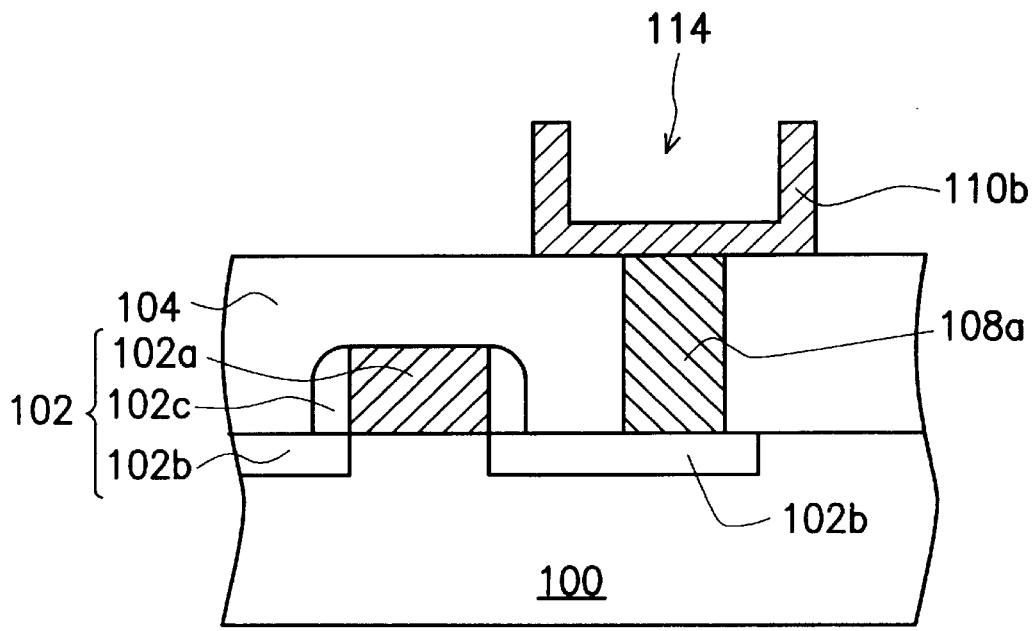

Reference will now be made in detail to the present preferred embodiments of the invention, examples of which are illustrated in the accompanying drawings. Wherever possible, the same reference numbers are used in the drawings and the description to refer to the same or like parts.

Figure 2A:
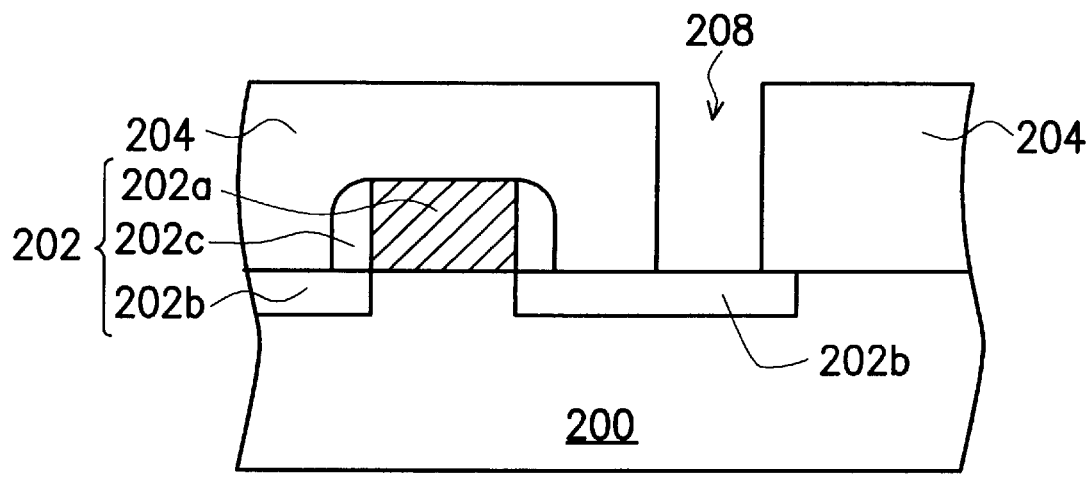
FIGS. 2A–2H show cross-sectional views of a manufacturing method of a crown-like bottom plate of a capacitor according to a preferred embodiment of the invention.
Figure 2B:
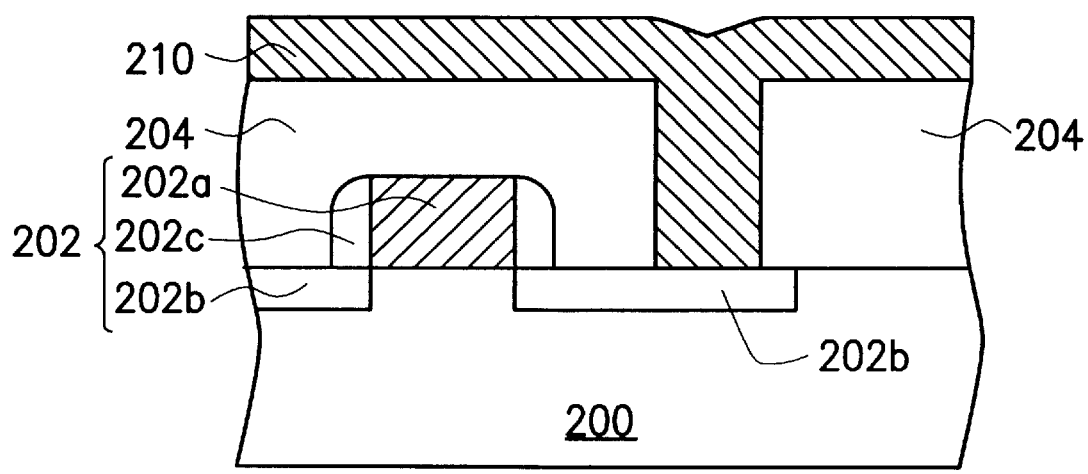
Figure 2C:
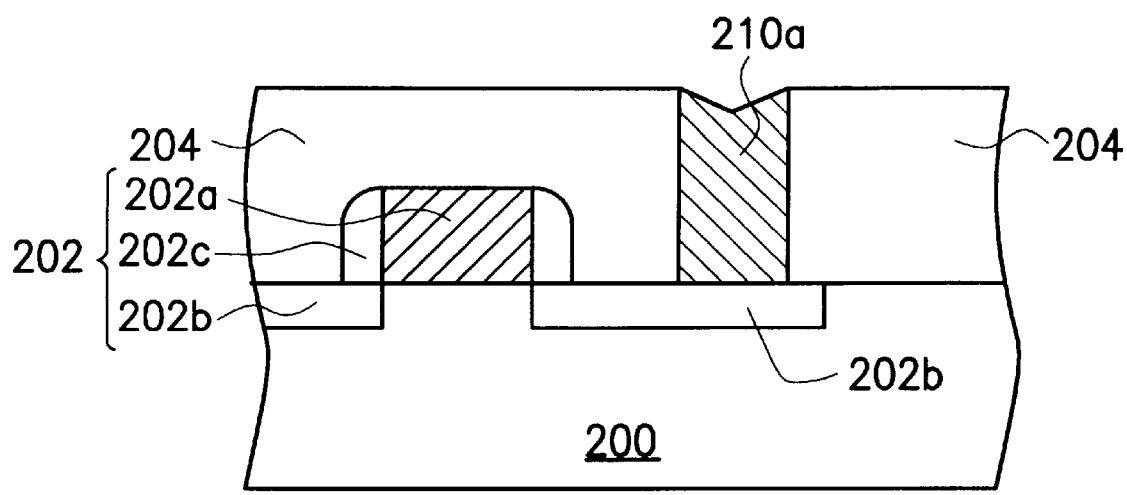

FIGS. 2A–2H show cross-sectional views of a manufacturing method of a crown-like bottom plate of a capacitor according to a preferred embodiment of the invention. Referring to FIG. 2A, a metal oxide semiconductor transistor (MOS transistor) 202 is formed in a semiconductor substrate 200. The MOS transistor 202 comprises a gate 202a, a pair of source/drain regions 202b and a spacer 202c. An insulation oxide layer 204 is then deposited over the substrate 200 and a contact opening 208 is formed in the insulation oxide layer 204. The contact opening 208 is formed above the source/drain region 202b and a portion of the source/drain region 202b, which is under the contact opening 208, is exposed. Next, referring to FIG. 2B, a polysilicon layer 210 is formed over the insulation oxide layer 204 and the contact opening 208 is then filled therewith. After that, referring to FIG. 2C, the polysilicon layer 210 is etched and then the portion of the polysilicon layer 210 over the insulation oxide layer 204 is eliminated and the portion of the polysilicon layer 210 filled in the contact opening 208 is reserved. The reserved portion of the polysilicon layer 210 is a contact plug 210a for a capacitor.

Figure 2D:
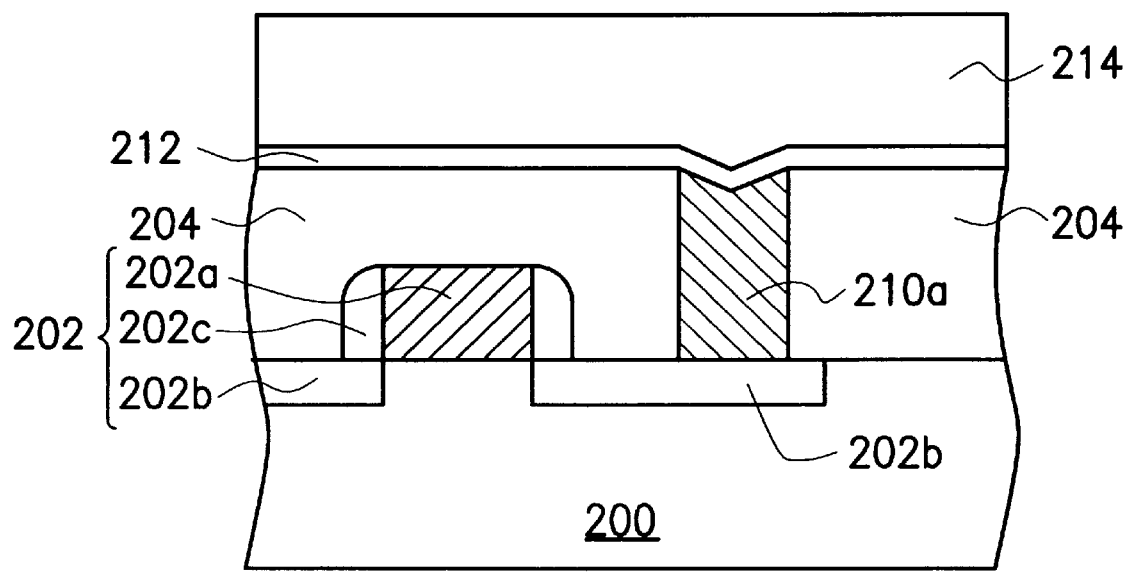

Referring to FIG. 2D, a stop layer 212 is formed over the insulation oxide layer 204 and the contact plug 210a. The stop layer 212 is formed by, for example, a method of low-pressured chemical vapor deposition (LPCVD). The stop layer 212 is composed of, for example, tetra-ethyl-ortho-silicate (TEOS). Next, a first dielectric layer 214 is deposited over the substrate 200 by a method of, for example, chemical vapor deposition or plasma chemical vapor deposition. The first dielectric layer 214 is composed of, for example, borophosphosilicate glass (BPSG).

Figure 2E:
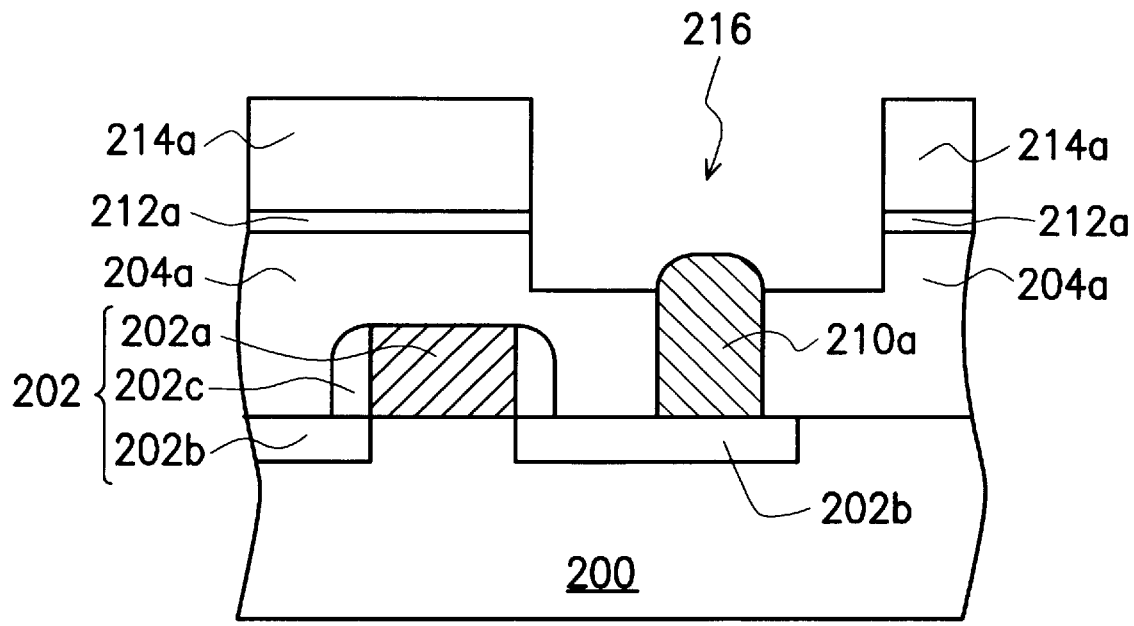
Figure 2F:
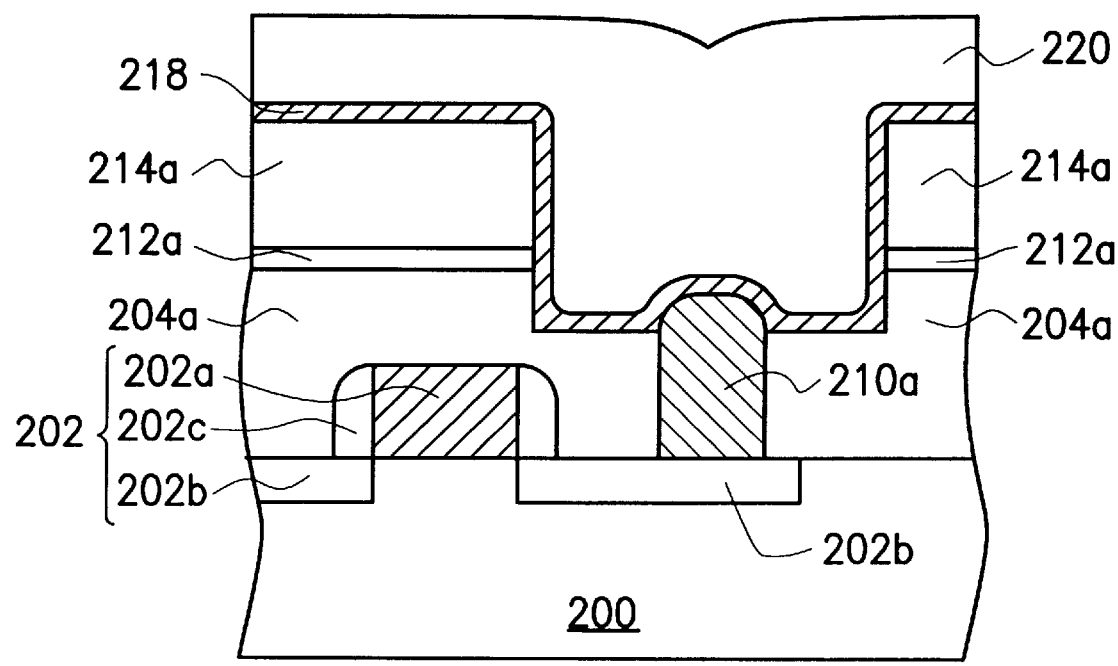

Next, referring to FIG. 2E, the first dielectric layer 214, the stop layer 212 and the insulation oxide layer 204 are defined by a photolithography process and are respectively denoted by 214a, 212a and 204a, and an opening 216 is then formed above the source/drain region 202b. A portion of the contact plug 210a is then exposed in the opening 216. Next, referring to FIG. 2F, along with the profiles of the opening 216 and the first dielectric layer 214a, a conductive layer 218 is formed above the first dielectric layer 214a and the inner surface of the opening 216. The conductive layer 218 is formed by a method of, for example, chemical vapor deposition and is preferably composed of tungsten silicide. The conductive layer 218 is also formed by, at first, depositing a tungsten nitride layer as a glue layer, and then a tungsten layer being formed thereon. The glue layer is helpful for improving the capability of adhesion between the polysilicon layer and the tungsten layer.

Next, a second dielectric layer 220 is deposited over the conductive layer 218 and the opening 216 is filled therewith. The second dielectric layer 220 is composed of, for example, borophosphosilicate glass (BPSG), which can be replaced with material of a photo resist layer.

Figure 2G:
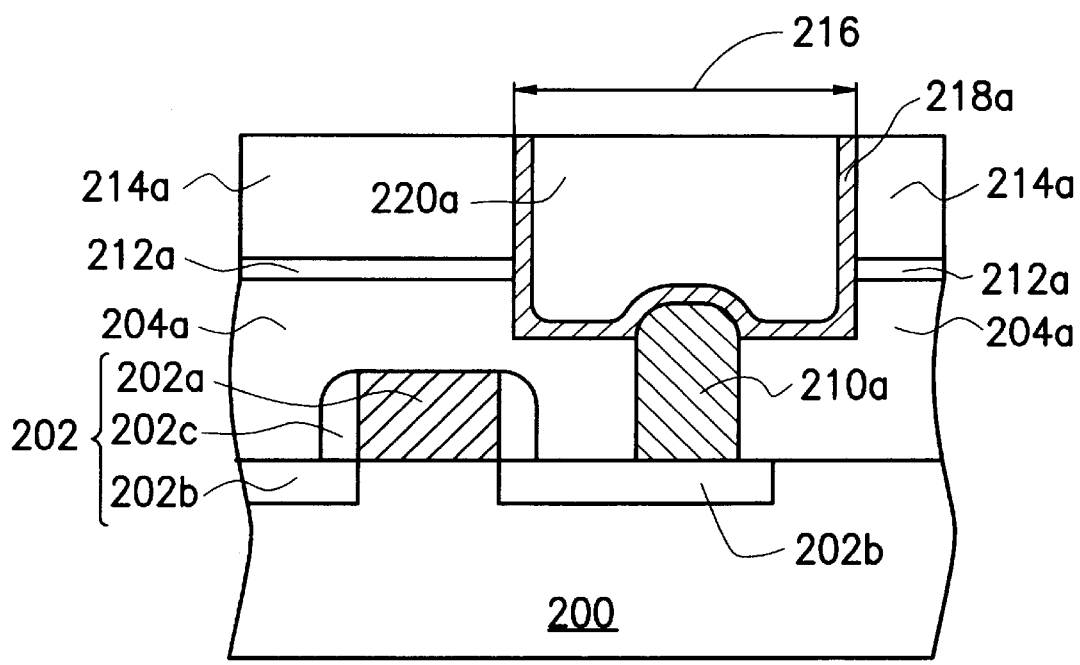
Figure 2H:
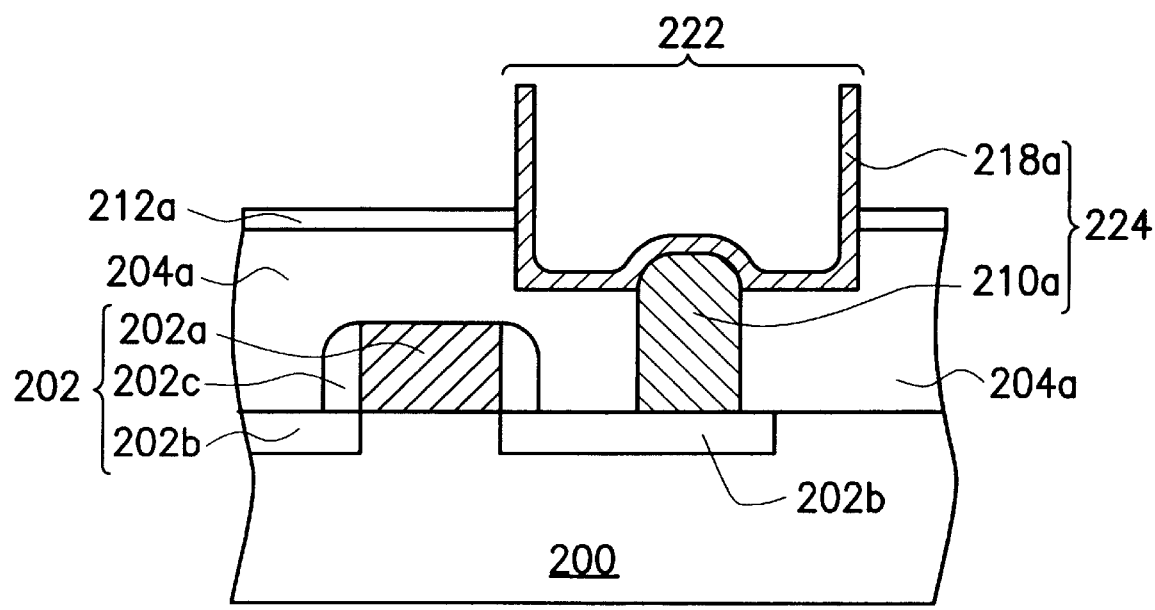

Referring to FIG. 2G, an etching process is performed and the second dielectric layer 220 and the conductive layer 218 are etched back to the surface of the first dielectric layer 214a. That is, only a portion of the second dielectric layer 220 and a portion of the conductive layer 218, which are located in the opening 216, are reserved and then denoted as shown in FIG. 2G by respectively 220a and 218a. The etching process is a method of chemical mechanical polishing or using a metal etching solvent for etching. Next, the first dielectric layer 214a and the reserved second dielectric layer 220a are introduced by an selective etching process using solvent with a high selectivity, for example, hydrofluoric acid. In the selective etching process, the stop layer 212 and the conductive layer 218a are served as stop layers. A crown-liked conductive plate 222 is therefore formed over the substrate 200. The crown-liked conductive plate 222 serves as a bottom plate of the DRAM capacitor.

There are several advantages in the invention. The bottom plate of a DRAM capacitor is composed of metal materials, such as tungsten silicide or tungsten with a tungsten nitride layer as a glue layer. It can avoid the happening of the leakage phenomenon in a stacked structure of metal-insulation-metal layers or metal-insulation-substrate layers, which causes stored charges lost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of forming a bottom plate for a capacitor on a substrate, wherein the substrate comprises a MOS transistor having a gate and a pair of source/drain regions, wherein the method comprises:

forming an insulation oxide layer on the substrate and the gate;

forming a contact opening in the insulation oxide layer, wherein one of the source/drain regions is exposed through the contact opening;

forming a contact plug in the contact opening;

forming a stop layer over the insulation oxide layer and the contact plug;

forming a first dielectric layer over the stop layer;

forming an opening which penetrates the first dielectric layer, the stop layer and the insulation oxide layer, wherein the bottom of the opening exposes a portion of the insulation oxide layer and the top portion of the contact plug, and the stop layer is not used as a stop while forming the opening; and forming a crown-shaped conductive plate over the insulation oxide layer and the contact plug, wherein the crown-shaped conductive plate penetrates the insulation oxide layer and the stop layer, wherein the bottom of the crown-shaped conductive plate is electrically connected to the contact plug, wherein the crown-shaped conductive plate is composed of tungsten silicide.

2. The method of claim 1, wherein the step of forming a crown-shaped conductive plate further comprises:

forming a tungsten silicide layer over the opening and the first dielectric layer;

forming a second dielectric layer over the tungsten silicide layer, where the opening is filled by the second dielectric layer;

eliminating a portion of the second dielectric layer and a portion of the tungsten silicide layer, wherein the tungsten silicide layer in the opening and the second dielectric layer in the opening are reserved; and eliminating the reserved second dielectric layer and the first dielectric layer to expose the stop layer and the surface of the reserved tungsten silicide layer, whereby the reserved tungsten silicide layer serves as the crown-shaped conductive plate.

3. The method of claim 1, wherein the stop layer is composed of a tetra-ethyl-ortho-silicate (TEOS).

4. The method of claim 1, wherein the stop layer is formed by a method of chemical vapor deposition.

5. The method of claim 1, wherein the contact plug is composed of polysilicon.

6. A manufacturing method of forming a bottom plate for a capacitor on a substrate, wherein the substrate comprises a MOS transistor having a gate and a pair of source/drain regions, wherein the method comprises:

forming an insulation oxide layer on the substrate and the gate;

forming a contact opening in the insulation oxide layer, wherein one of the source/drain regions is exposed through the contact opening;

forming a contact plug in the contact opening;

forming a stop layer over the insulation oxide layer and the contact plug;

forming a first dielectric layer over the stop layer;

forming an opening which penetrates the first dielectric layer, the stop layer and the insulation oxide layer, wherein the bottom of the opening exposes a portion of the insulation oxide layer and the top portion of the contact plug, and the stop layer is not used as a stop while forming the opening; and forming a crown-shaped conductive plate over the insulation oxide layer and the contact plug, wherein the crown-shaped conductive plate penetrates the insulation oxide layer and the stop layer, wherein the bottom of the crown-shaped conductive plate is electrically connected to the contact plug, wherein the crown-shaped conductive plate is composed of a tungsten nitride layer and a tungsten layer on the tungsten nitride layer.

7. The method of claim 6, wherein the step of forming a crown-shaped conductive plate further comprises:

forming the tungsten nitride layer over the opening and the first dielectric layer;

forming the tungsten layer over the tungsten nitride layer;

forming a second dielectric layer over the tungsten nitride layer and the tungsten layer, where the opening is filled by the second dielectric layer;

eliminating a portion of the second dielectric layer and a portion of the tungsten nitride layer and the tungsten layer, wherein the tungsten nitride layer and the tungsten layer in the opening and the second dielectric layer in the opening are reserved; and eliminating the reserved second dielectric layer and the first dielectric layer to expose the stop layer and the surface of the reserved tungsten nitride layer and the tungsten layer, whereby the reserved tungsten nitride layer and the tungsten layer serve as the crown-shaped conductive plate.

8. The method of claim 6, wherein the stop layer is composed of a tetra-ethyl-ortho-silicate (TEOS).

9. The method of claim 6, wherein the stop layer is formed by a method of chemical vapor deposition.

10. The method of claim 6, wherein the contact plug is composed of polysilicon.

* * * * *